(12) United States Patent
Pierdomenico et al.

(10) Patent No.: US 8,093,953 B2
(45) Date of Patent: Jan. 10, 2012

(54) AMPLIFIER SYSTEM WITH DIGITAL ADAPTIVE POWER BOOST

(75) Inventors: John Pierdomenico, Temple, PA (US);
Zoltan Frasch, Hooksett, NH (US);
Charly El-Khoury, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 113 days.

(21) Appl. No.: 12/566,588

(22) Filed: Sep. 24, 2009

(65) Prior Publication Data

US 2010/0237944 A1    Sep. 23, 2010

Related U.S. Application Data

(60) Provisional application No. 61/162,180, filed on Mar. 20, 2009.

(51) Int. Cl.
*H03F 3/04* (2006.01)
(52) U.S. Cl. ........................................................ 330/297
(58) Field of Classification Search .................. 330/127, 330/261, 297
See application file for complete search history.

(56) References Cited

U.S. PATENT DOCUMENTS

| 5,406,192 | A | 4/1995 | Vinciarelli |
| 6,636,103 | B2 * | 10/2003 | Wurcer et al. ............... 327/536 |
| 2007/0252646 | A1 | 11/2007 | Leung et al. |

OTHER PUBLICATIONS

International Search Report in co-pending, related International Application No. PCT/US2010/027968, mailed May 17, 2010.

* cited by examiner

*Primary Examiner* — Khanh Nguyen
(74) *Attorney, Agent, or Firm* — Kenyon & Kenyon LLP

(57) ABSTRACT

An amplifier system with digital adaptive power boost includes a charge pump for providing a power supply to an amplifier. The charge pump may switch between a fixed input DC voltage and a boosted value for a certain period of time in response to an increase in an input signal to the amplifier. The charge pump may use a switching transistor which is switched on only when the input signal to the amplifier exceeds a threshold. The amplifier system may be used for envelope tracking, especially for envelope tracking of low duty cycle signals, e.g., xDSL or vDSL.

25 Claims, 18 Drawing Sheets

AMPLIFIER SYSTEM WITH DIGITAL ADAPTIVE POWER BOOST

CROSS-REFERENCE TO RELATED APPLICATIONS

This application claims priority to U.S. Provisional Patent Application No. 61/162,180, filed on Mar. 20, 2009, entitled "Amplifier System with Digital Adaptive Power Boost," which is herein incorporated by reference in its entirety.

BACKGROUND INFORMATION

The present invention relates to an amplifier system with on-demand power supply boost.

Amplifier efficiency is the ratio of power supplied by an amplifier to a load to the power supplied to the amplifier. The less power dissipation in an amplifier, the better the efficiency of the amplifier. For conventional amplifier systems (Class AB) with fixed supplies and processing signals with high peak-to-average (PAR) and low percentage actuation, there is a significant amount of wasted power. One method to reduce power is the on-demand power supply boost system which uses Class H technology on a much lower power supply voltage. However, the conventional amplifier system with on-demand power supply boost still has unnecessary power dissipation.

FIG. 1 illustrates a conventional amplifier system with on-demand power supply boost. Assume supplies of +6V and -6V are applied to VCC & VEE respectively. An amplifier 101 receives varying input signals INP1 and INP2 at an input terminal 102 and is powered by VCCP from a charge pump 103A and VEEP from a charge pump 103B. The charge pump 103A includes a transistor QA, a diode DA, a capacitor CA, and a current source 1031.

The transistor QA is a NPN transistor and is biased as a voltage follower, with its base coupled to the varying input signals via a mixer 105 and a gain circuit 104A, its collector coupled to a fixed DC voltage VCC, and its emitter coupled to the current source 1031. Assume the diode drop across the base-emitter junction of the transistor QA is 0.5V, the input signal at its base varies between -5V and 5V, the drop across the diode DA is 0.5V, and the fixed DC voltage Vcc is 6V. When the input signal at the base of the transistor QA is -5V, the transistor QA is off. The voltage at the top part of the capacitor CA is 5.5V (the 6V of the fixed DC voltage VCC minus the 0.5V voltage drop over the diode DA), and the voltage at the bottom part of the capacitor CA is -6V (the current source 1031 is saturated causing the bottom plate of CA, or node CAPP, to be drawn to VEE or -6V). Thus the total voltage across the capacitor CA is 11.5V. When the input signal at the base of the transistor QA rises from -5V to 5V, the voltage at the bottom part of the capacitor CA changes from -6V to +3.5V. Since the voltage across the capacitor CA cannot change instantly, the additional 9.5V boosts the voltage at the top part of the capacitor CA from 5.5V to 15V. Thus the amplifier 101 is momentarily provided with a power supply voltage VCCP of 15V when needed although there is only a power supply Vcc of 6V available.

Similarly, the charge pump 103B includes a transistor QB, a diode DB, a capacitor CB, and a current source 1032, and provides to the amplifier 101 a power supply voltage VEEP switching between -5.5v and -15V. With this system, a dynamic supply of 30V is possible with only 12V total DC supply.

As shown in FIG. 2, the charge pumps 103A and 103B provide boost voltages VCCP and VEEP, respectively, to the amplifier 101 in excess of its power supply when the input peaks on the terminal 102 predict that output (VOPA and VONA) peaks will exceed the capacity of the power supply, and assure that there is sufficient power supply voltage to accommodate peak signals when necessary to avoid clipping and yet keep the voltage supply on a low level when the input is operating in its normal range of RMS voltage.

Gain circuits 104A and 104B are provided so that when the input signal peaks, the voltages VCCP and VEEP provided by charge pumps 103A and 103B will be sufficient to provide the necessary supply voltages to the amplifier 101 in view of the amplifier 101's particular gain. The mixer 105 ensures that the proper swing polarity reaches amplifiers 104A and 104B regardless of the swing polarity at the terminal 102.

Even with its power savings over conventional class AB systems, this on-demand amplifier system has unnecessary power dissipation, since transistors QA and QB work as voltage followers and remain on, and VCCP and VEEP vary continuously in correspondence with input signals at the terminal 102 even when the input does not peak (e.g., before t1 in FIG. 2) and it is unnecessary to compensate for excessive peaks. Therefore, it would be desirable to provide a more power efficient amplifier system with on-demand power supply boost.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

Figure 1:
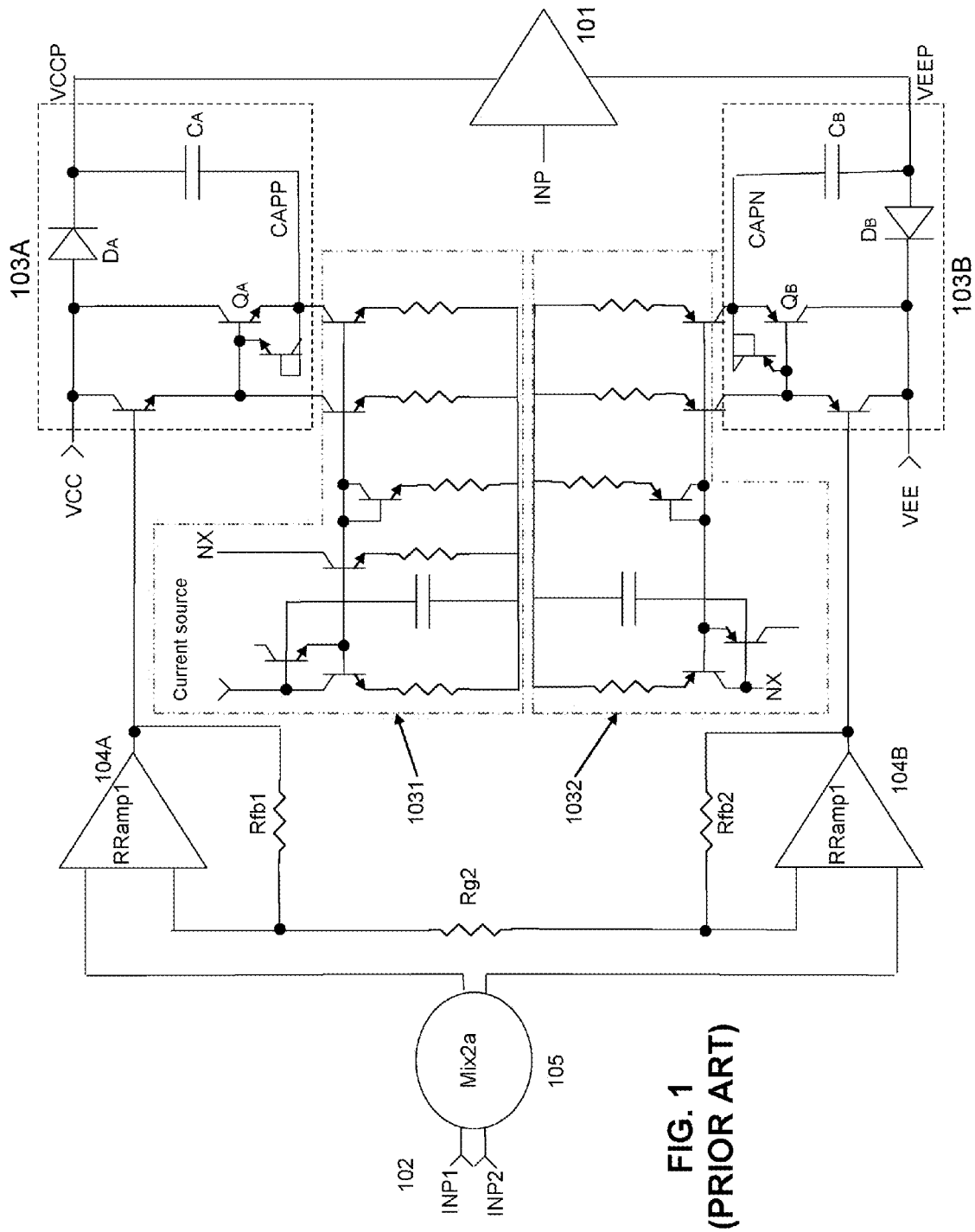
FIG. 1 illustrates a conventional amplifier system with on-demand power supply boost.
Figure 2:
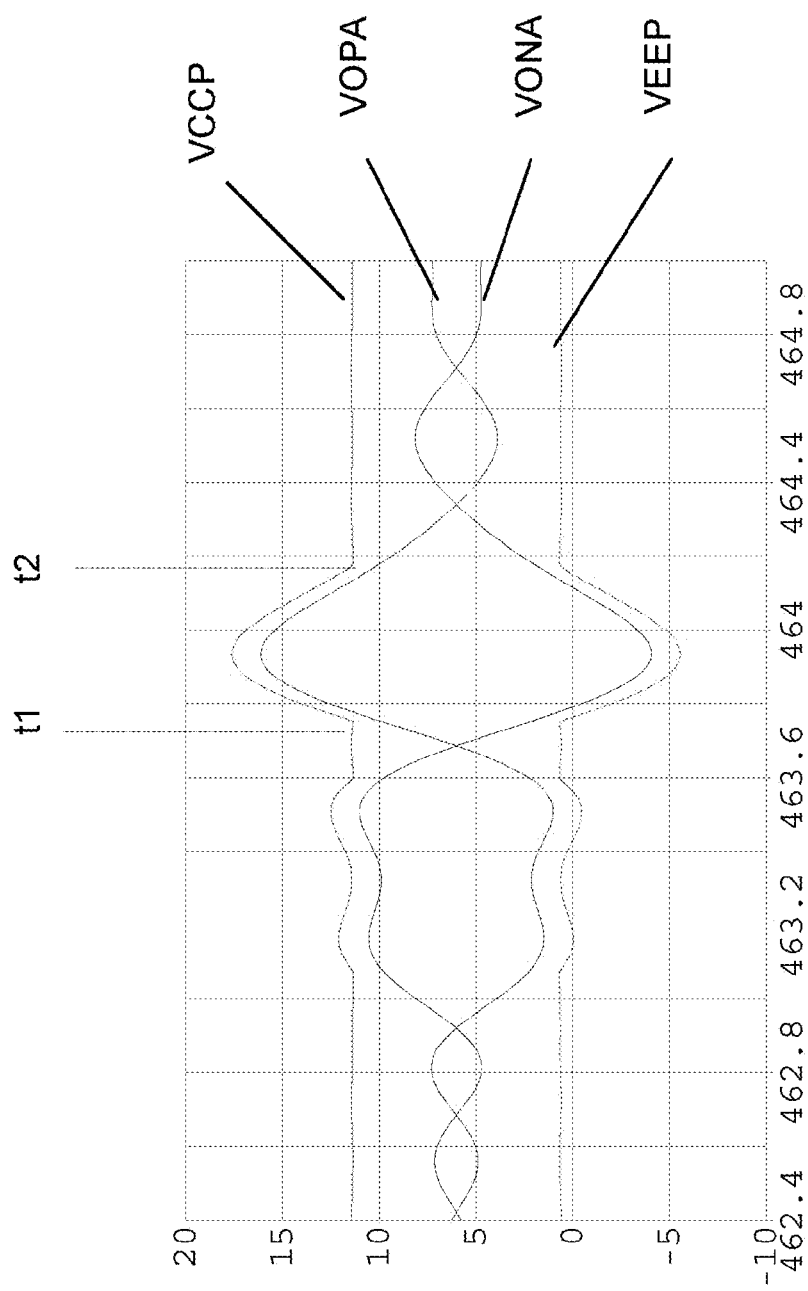
FIG. 2 illustrates exemplary waveforms of VEEP and VCCP in the conventional amplifier system shown in FIG. 1.

The present invention provides the conventional amplifier system of FIG. 1 with an improved charge pump to increase the power efficiency of an amplifier system. The charge pump may switch between a fixed input DC voltage and a boosted value for a certain period of time in response to an increase in an input signal to the amplifier. The charge pump may use a switching transistor which is switched on only when the input signal to the amplifier exceeds a threshold. The amplifier system may be used for envelope tracking, especially for envelope tracking of low duty cycle signals, e.g., Code Division Multiple Access (CDMA), Enhanced Data rate for GSM Evolution (GSM-EDGE) or other conventional cellular systems. The amplifier system may also be used for high peak-to-average systems with low duty cycles such as in xDSL, ADSL and VDSL telco operations.

Figure 3:
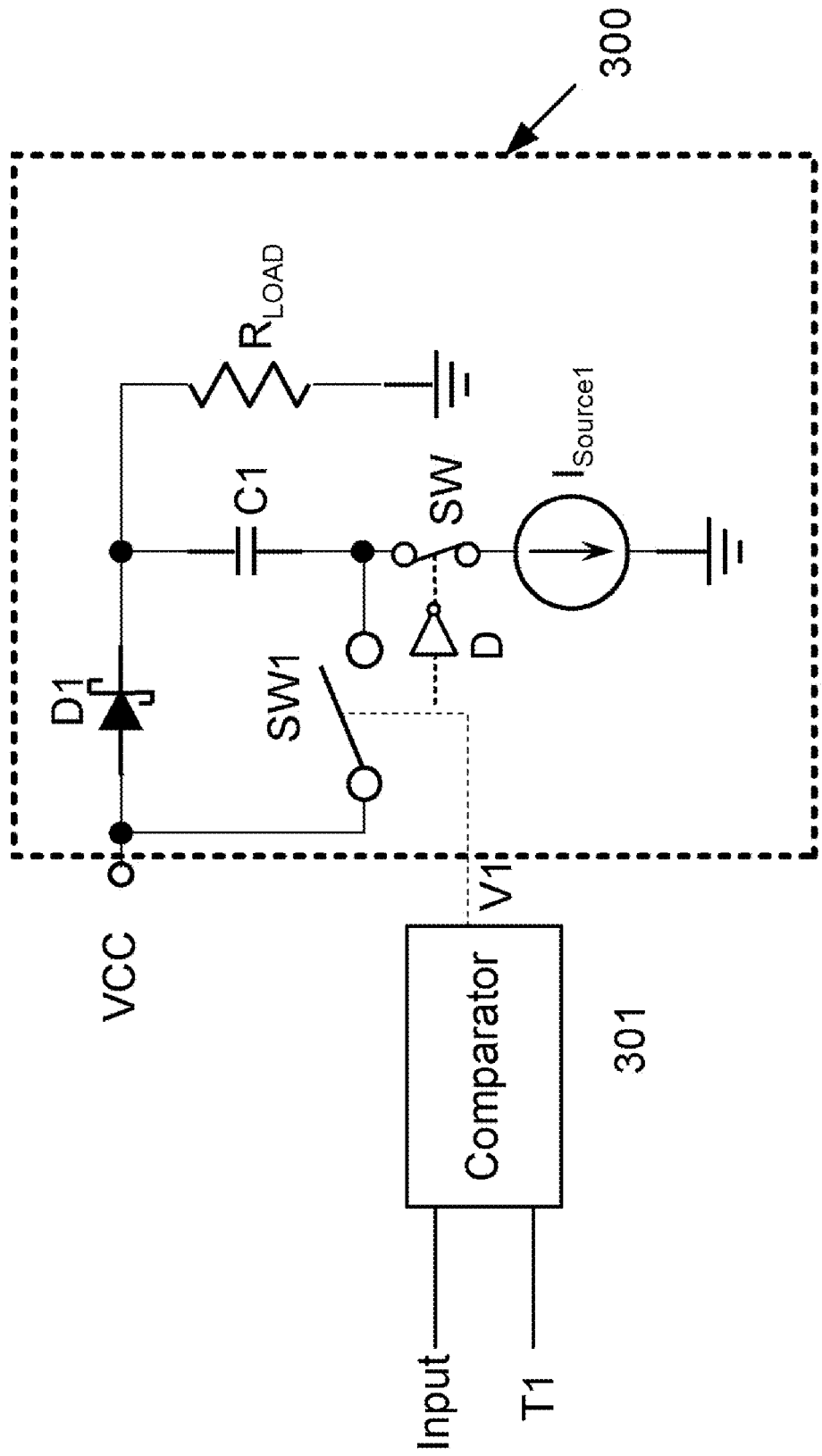
FIG. 3 is a block diagram of a charge pump according to one embodiment of the present invention which may replace the charge pump 103A in FIG. 1.

FIG. 3 is a circuit diagram of a charge pump 300 according to one embodiment of the present invention which may replace the charge pump 103A in FIG. 1. As shown, a diode D1 may be a Schottky diode, and a load RLOAD may represent the amplifier 101. A switch SW1 may be an active switching device such as a PNP bipolar transistor or a p-channel MOSFET, and may be controlled by a control signal V1. In one example, the control signal V1 may be a binary output of a comparator 301 which compares the input signal to the amplifier 101 and a threshold T1. The control voltage V1 may also control a switch SW to disconnect the current source $I_{SOURCE1}$ from the charge capacitor C1 when the switch SW1 is closed and the charge pump is activated, so as to stop the current source $I_{SOURCE1}$ from pulling current from VCC. A unidirectional isolation device D, e.g., a diode, may be used to stop the current source $I_{SOURCE1}$ from pulling current from V1.

When the input signal to the load $R_{LOAD}$ does not exceed the threshold T1, the switch SW1 may be turned off, the charge pump 300 may not be activated, and the capacitor C1 may be charged by the voltage VCC, along the circuit path including the diode D1, the capacitor C1, the switch SW, and a current source $I_{source1}$, to output a voltage to the load $R_{LOAD}$. When the input signal to the load $R_{LOAD}$ exceeds the threshold T1, the control signal V1 may become 0 to turn on the switch SW1, turn off the switch SW, and push the output voltage to the load $R_{LOAD}$ higher than the voltage VCC.

Figure 4:
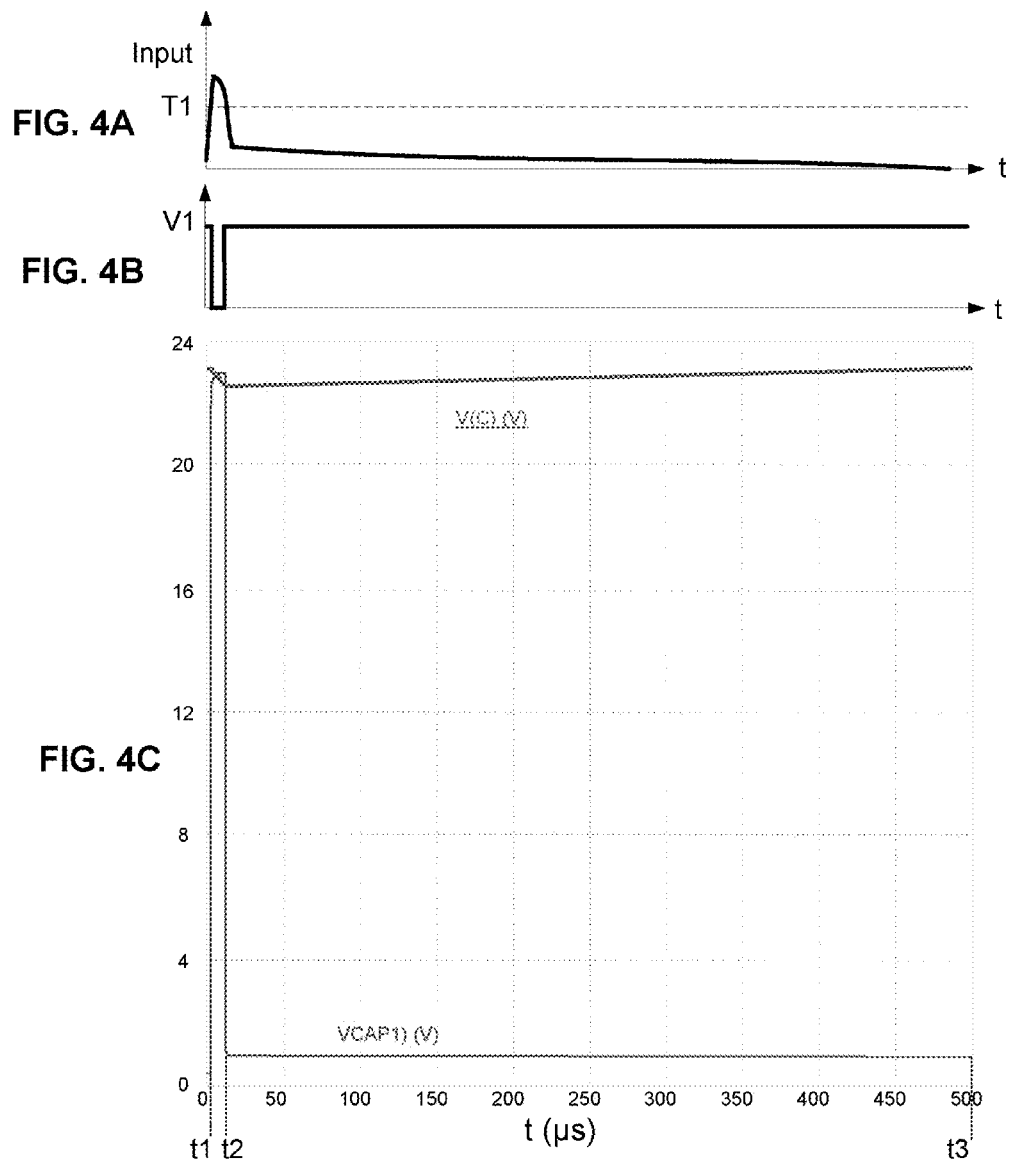
FIGS. 4A-4C illustrate exemplary waveforms of signals in the charge pump shown in FIG. 3.

FIG. 4A is an exemplary input signal to the load $R_{LOAD}$, FIG. 4B is an exemplary waveform of the control signal V1 which controls the switch SW1 in the charge pump 300, and FIG. 4C is an exemplary waveform of the voltage across the capacitor C1 in the charge pump 300.

As shown in FIGS. 4A, 4B and 4C, when t=0, the input signal to the load $R_{LOAD}$ may be below the threshold T1, the control signal V1 may be high, the switch SW1 may be open, and the switch SW may be closed. Assume the voltage drop across the diode D1 may be VD≈0.5V, and the voltage drop across the switch SW1 may be VSW1≈1V. The voltage across $R_{LOAD}$ may be (VCC−VD), and the capacitor C1 may be charged to:

(VCC−VD)≈(VCC−0.5)V

When t=t1, the input signal to the load $R_{LOAD}$ may exceed the threshold T1, the control signal V1 may turn low, and the switch SW1 may be closed, connecting the capacitor C1 in series with VCC. The switch SW may be open, disconnecting the capacitor C1 and the current source $I_{SOURCE1}$. As a result, the voltage across $R_{LOAD}$ may increase to:

(VCC−VSW1)+(VCC−VD)≈(VCC−1)+(VCC−0.5)
=2VCC−1.5 V

When t=t2, the input signal to the amplifier 101 may fall below the threshold T1, the control signal V1 may turn high, and the switch SW1 may be open. The voltage across $R_{LOAD}$ may return to (VCC−VD). The voltage across the capacitor C1 may decrease to:

(VCC−VD)(e$^{-(t2-t1)/C \times RLOAD}$)−(VCC−VSW)(1−e$^{-(t2-t1)/(C \times RLOAD)}$) and the capacitor C1 may begin to recharge.

When t=t3, the capacitor C1 may be fully charged, and the duty cycle (the ratio between the pulse duration and the period) may be:

$$(t2-t1)/(t3-t2) = \frac{1}{C(2VCC-VD-VSW)} $$
$$1 + \frac{(1-e^{-(t2-t1)\frac{1}{C \times RLOAD}})}{ISOURCE \times (t2-t1)}$$

Figure 5:
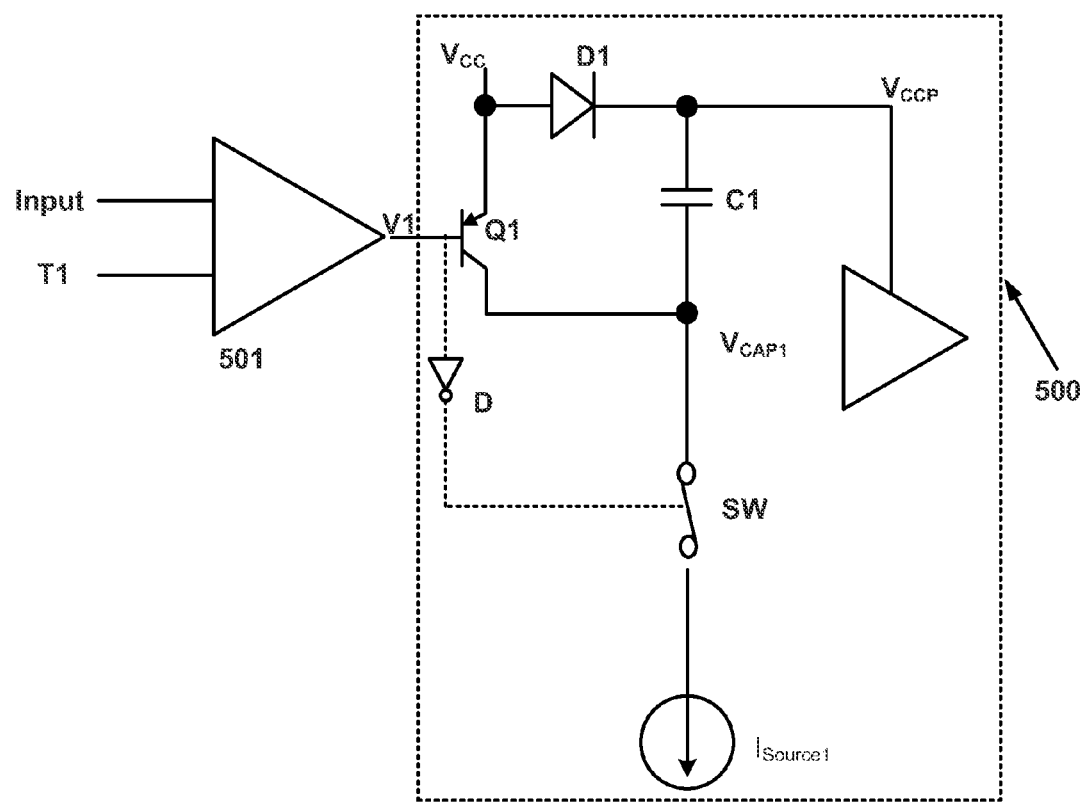
FIG. 5 illustrates a schematic diagram of the charge pump shown in FIG. 3.

FIG. 5 is a schematic diagram of a charge pump shown in FIG. 3. As shown, a charge pump 500 may include a switching transistor Q1 controlled by the control signal V1, the current source ISOURCE1, the capacitor C1 and a load which may be an amplifier, e.g., the amplifier 101. The switching transistor Q1 may be a PNP bipolar transistor, with its base coupled to the control signal V1, and its emitter coupled to the fixed DC voltage Vcc (e.g., 24V). The bottom part of the capacitor C1 may be grounded via the current source ISOURCE1, and the top part of the capacitor C1 may be coupled to Vcc via the diode D1. The collector of the switching transistor Q1 may be coupled to the bottom part of the capacitor C1, and the voltage VCCP at the top part of the capacitor C1 may be used as an output of the charge pump 500 to power the amplifier 101. A switch SW may be coupled between the capacitor C1 and the current source ISOURCE1, and a diode D may be coupled between the output of the comparator 501 and the current source $I_{SOURCE1}$.

The control signal V1 may be a binary output of a comparator 501. The comparator 501 may compare the input signal to a load (e.g., the amplifier 101) and the threshold T1, output a low signal to turn on the switching transistor Q1 to activate the charge pump 500 when the input signal exceeds the threshold T1, and output a high signal to turn off the switching transistor Q1 and the charge pump 500 when the input signal does not exceed the threshold T1. Thus, the charge pump 500 may be activated only when the input signal exceeds the threshold T1 and it is necessary to compensate for excessive peaks.

Figure 6A:
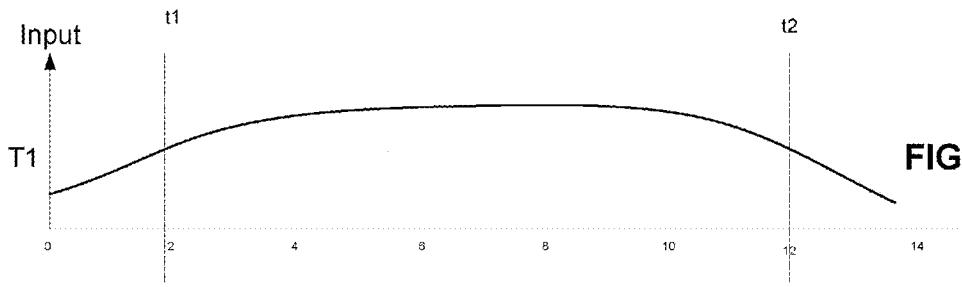
FIGS. 6A-6E illustrate exemplary waveforms of signals in the charge pump shown in FIG. 5.
Figure 6B:
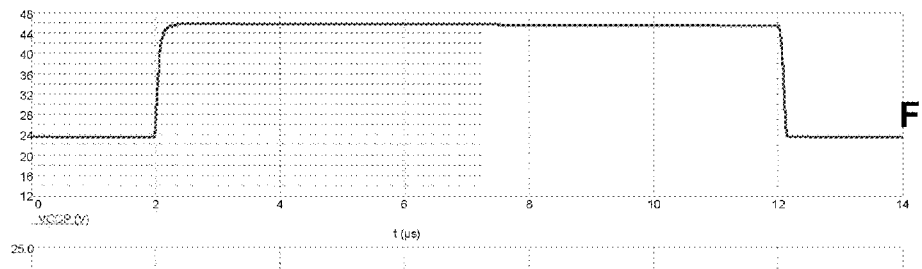
Figure 6C:
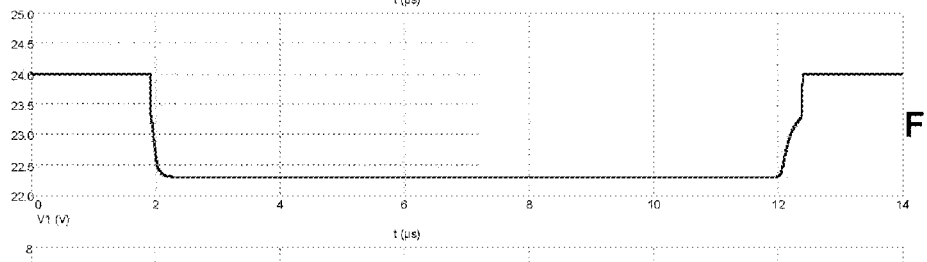
Figure 6D:
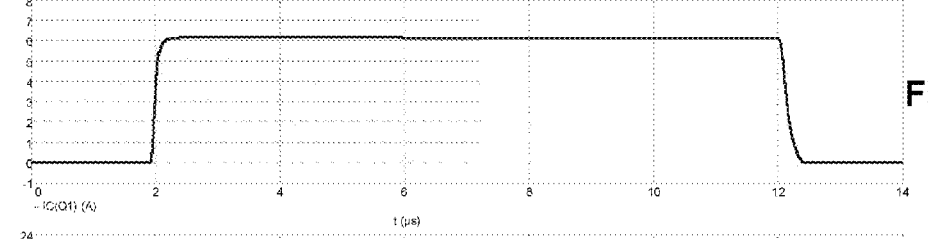
Figure 6E:
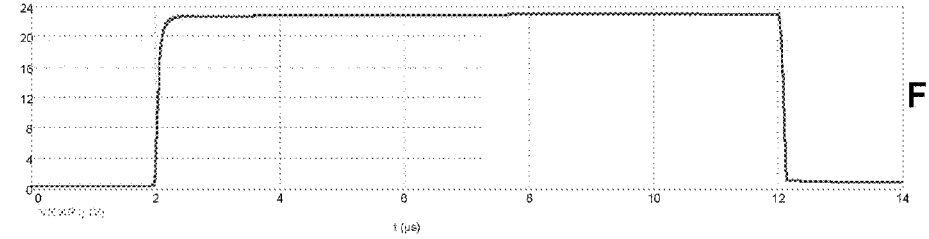

FIGS. 6A-6E are exemplary waveforms of signals in the charge pump shown in FIG. 5. Specifically, FIG. 6A is an exemplary waveform of the input signal, FIG. 6B is an exemplary waveform of the output of the charge pump VCCP, FIG. 6C is an exemplary waveform of the control signal V1, FIG. 6D is an exemplary waveform of the current passing the switching transistor Q1, and FIG. 6E is an exemplary waveform of the voltage VCAP1 at the bottom part of the capacitor C1.

Assume that the voltage drop across the base-collector junction of the transistor Q1 is about 0.5V, and the voltage drop across the diode D1 is about 0.5V. When t=0, the input signal to the amplifier 101 may be below the threshold T1, as shown in FIG. 6A; and the control signal V1 may be high, as shown in FIG. 6C. FIG. 6D indicates that the switching transistor Q1 may be turned off, since the current passing through the switching transistor Q1 is close to 0. Consequently, the charge pump 500 may not be activated. The voltage across the capacitor C1 may be about 23.5V, by deducting the drop across the diode D1 (0.5V) from VCC (24V). VCAP1 may be about 0V, as shown in FIG. 6E. As shown in FIG. 6B, the output voltage VCCP may be about 23.5V, the difference between VCC (24V) and the drop across the diode D1 (0.5V).

When t=t1, the input signal to the amplifier 101 may exceed the threshold T1, as shown in FIG. 6A; and the control signal V1 may turn low, as shown in FIG. 6C. FIG. 6D indicates that the switching transistor Q1 may be turned on, since the current passing through the switching transistor Q1 increases to about 6A from 0. As shown in FIG. 6E, the voltage VCAP1 may be pushed from about 0V to about 23.5V, by deducting the diode drop across the base-collector junction of the transistor Q1 (1V) from VCC (24V). Since the voltage across the capacitor C1 cannot change instantly, the additional 23.5V of VCAP1 may push the output voltage VCCP about 23.5V higher and become about 47V, as shown in FIG. 6B.

When t=t2, the input signal to the amplifier 101 may fall below the threshold T1, as shown in FIG. 6A; and the control signal V1 may turn high, as shown in FIG. 6C. FIG. 6D indicates that the switching transistor Q1 may be turned off, since the current passing through Q1 almost falls to 0. The capacitor C1 may begin to charge, driving VCAP1 to about 0V, as shown in FIG. 6E. Consequently, the output voltage VCCP may drop to about 23.5V, as shown in FIG. 6B.

Thus, during the 10 µs between t1 and t2 when the input signal to the amplifier exceeds a predetermined threshold T1 and makes the control signal V1 low, the charge pump 500 may be actuated and the amplifier 101 may be driven to a higher voltage state (e.g., 47V). Otherwise, the charge pump 500 is not actuated and the amplifier 101 may operate at a lower quiescent point. Thus, the charge pump 500 may be activated to drive the amplifier 101 to a higher voltage state only when the input on the terminal 102 of the amplifier 101 exceeds the threshold T1 thus predicting that the output of the amplifier 101 may exceed the capacity of the power supply and it is necessary to pump up VCCP to assure that there is sufficient power supply voltage to accommodate the input signal to avoid clipping. Unnecessary power dissipation may be avoided.

Figure 7:
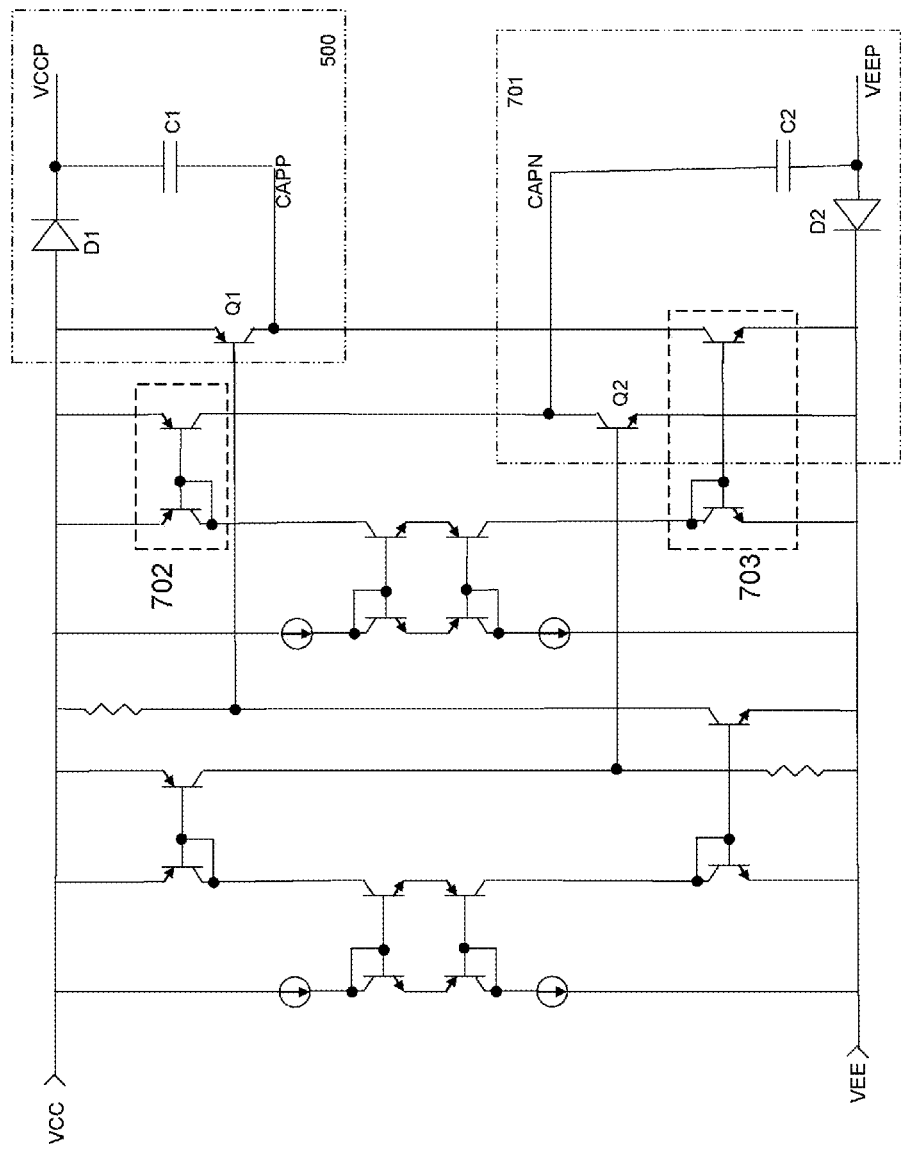
FIG. 7 illustrates an amplifier system with digital adaptive power boost according to one embodiment of the present invention.

FIG. 7 illustrates a digital adaptive power boost for an amplifier system according to one embodiment of the present invention. As shown, the charge pump 500 and its mirror version 701 may generate voltages VCCP and VEEP respectively to power an amplifier. In addition to avoiding unnecessary power dissipation, the power boost has a simpler architecture as compared to the one in FIG. 1. Compared with the current sources 1031 and 1032 shown in FIG. 1, the current sources 702 and 703 shown in FIG. 7 employ fewer parts.

Figure 8:
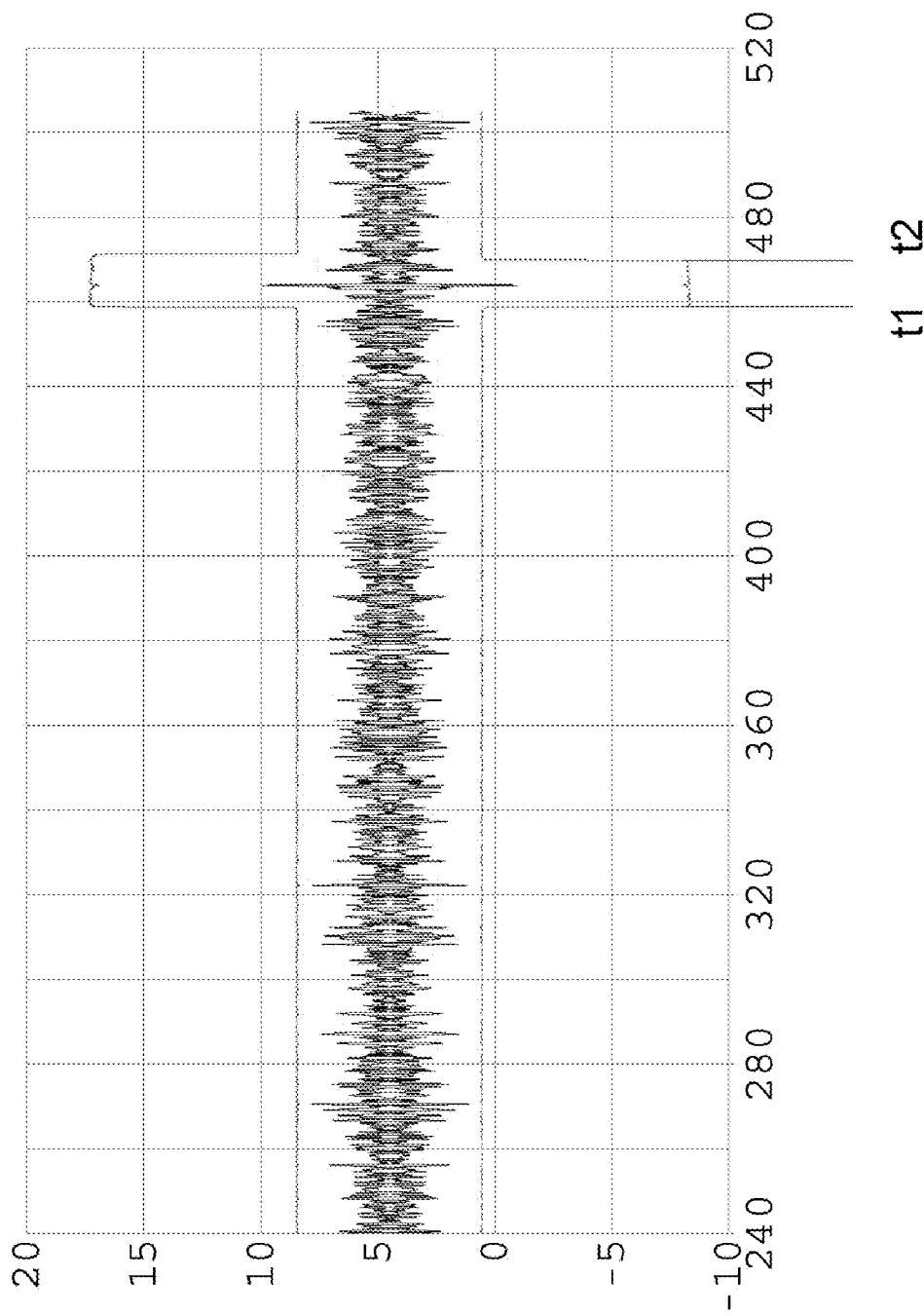
FIG. 8 is an exemplary waveform of voltages VCCP and VEEP generated by charge pumps 500 and 701.

FIG. 8 is an exemplary waveform of voltages VCCP and VEEP generated by charge pumps 500 and 701. Since the switching transistor Q1 in the charge pump 500 and a switching transistor Q5 in the charge pump 701 are generally off and are switched on only when the outputs may overdrive the power supply and compensating for excessive peaks may become necessary, their duty cycles may be significantly reduced, and consequently their power efficiency may be significantly improved. In FIG. 8, the input signal exceeds the threshold T1 only once, between t1 and t2, and the charge pump is turned on only once.

Figure 9:
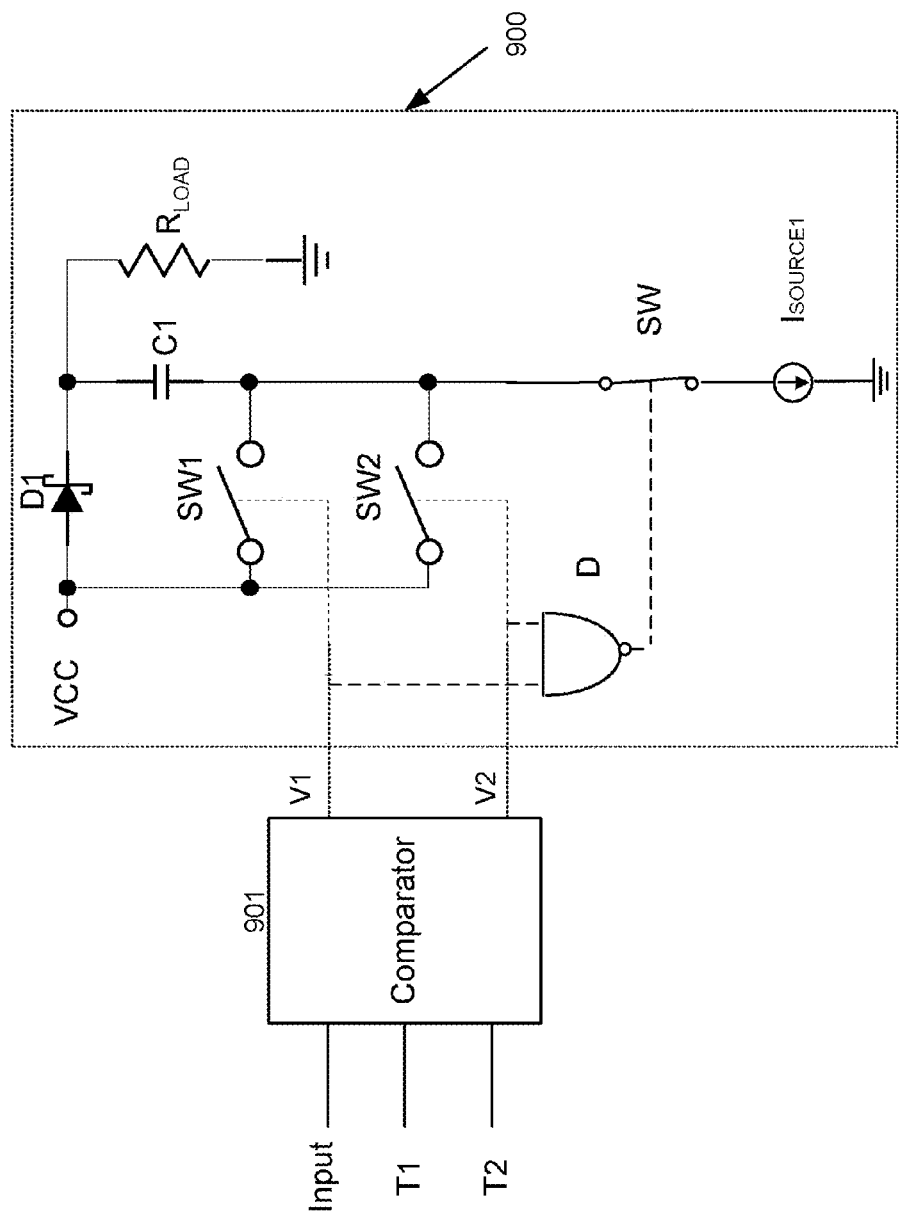
FIG. 9 is a block diagram of a charge pump according to one embodiment of the present invention.

FIG. 9 is a block diagram of a charge pump according to one embodiment of the present invention. A second switch SW2 controlled by a control signal V2 may be added to the charge pump 300 shown in FIG. 3. The control signal V2 may be a binary output of a comparator which compares the input signal to the amplifier 101 to a second threshold T2, which may be higher than T1, so that the output voltage of the charge pump 900 may have an additional step. In one embodiment, a comparator 901 may be used to compare the input signal and the first threshold T1 to output the control signal V1 and compare the input signal and the second threshold T2 to output the control signal V2. Current through SW1 and SW2 may determine output voltage steps. For a predetermined output voltage step, magnitudes of control signals V1 and V2 may need to be adjusted when load resistance changes. Similarly to FIG. 3, a switch SW may be used to stop the current source $I_{SOURCE1}$ from pulling current from VCC when the switch SW1 and/or SW2 is closed and the charge pump is activated. A unidirectional isolation device D may be used to stop the current source $I_{SOURCE1}$ from pulling current from V1 and/or V2.

Figure 10:
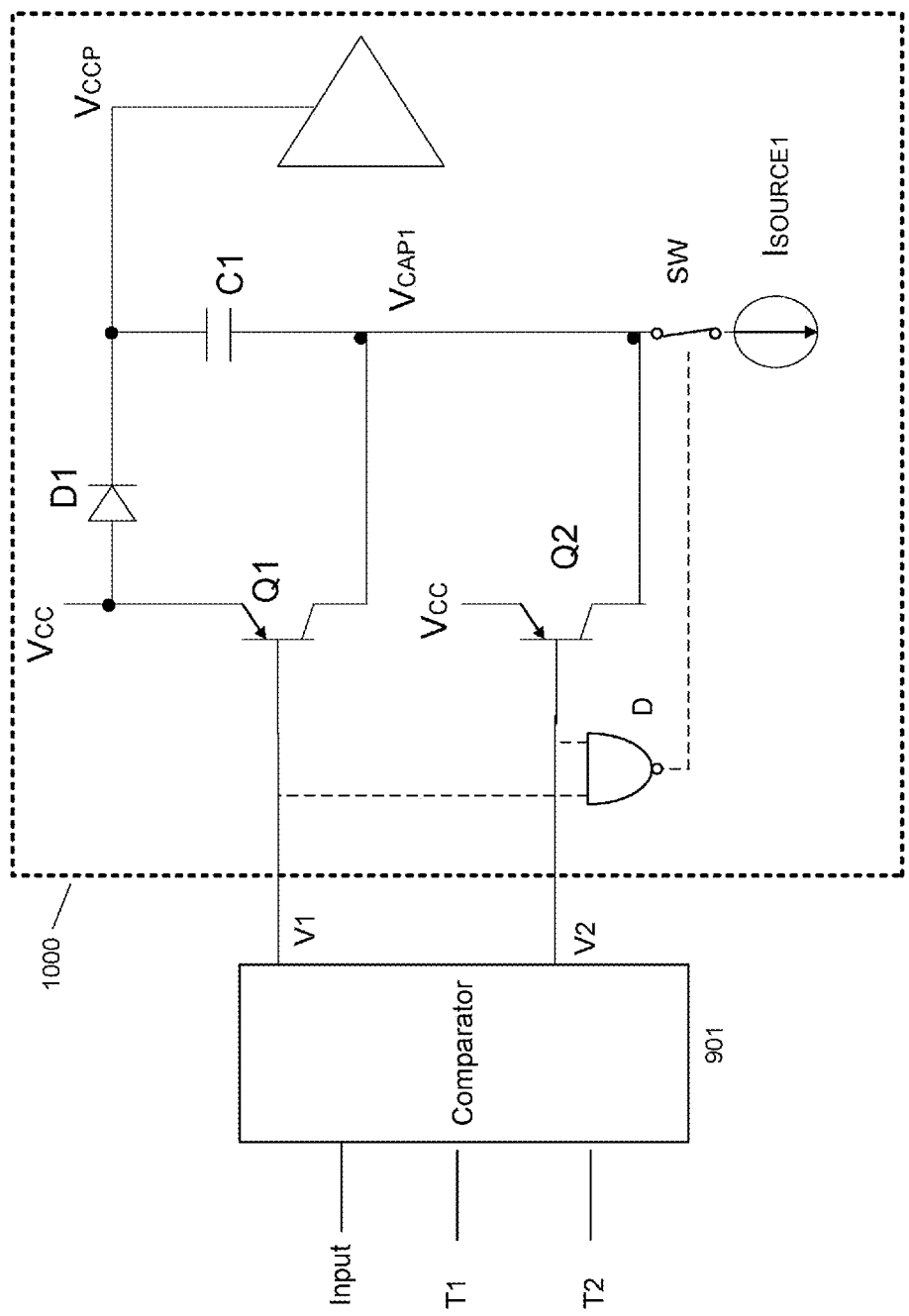
FIG. 10 is a schematic diagram of the charge pump 900 in FIG. 9.

FIG. 10 is a schematic diagram of the charge pump 900 in FIG. 9. A second switching transistor Q2 controlled by the second control signal V2 may be added to the circuit 500 shown in FIG. 5 to generate the additional boosted voltage step. As shown, a charge pump 1000 may have the first switching transistor Q1 switched on and off by the first control signal V1, the second switching transistor Q2 switched on and off by the second control signal V2, the diode D1, the capacitor C1 and the current source $I_{SOURCE1}$. The collector of the switching transmitter Q1 and the collector of the switching transmitter Q2 may be coupled to the bottom part of the capacitor C1, respectively.

Figure 11A:
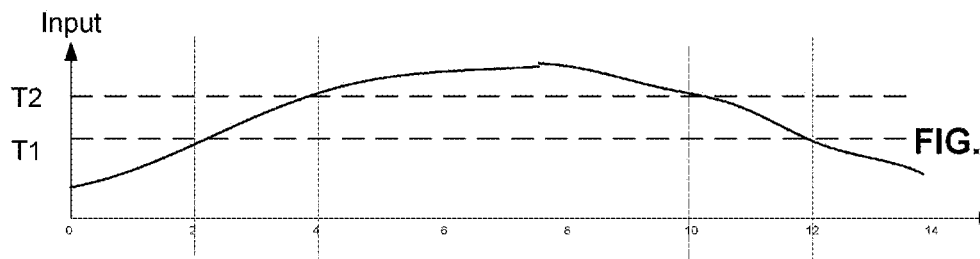
FIGS. 11A-11E illustrate exemplary waveforms of signals in the charge pump in FIG. 10.
Figure 11B:
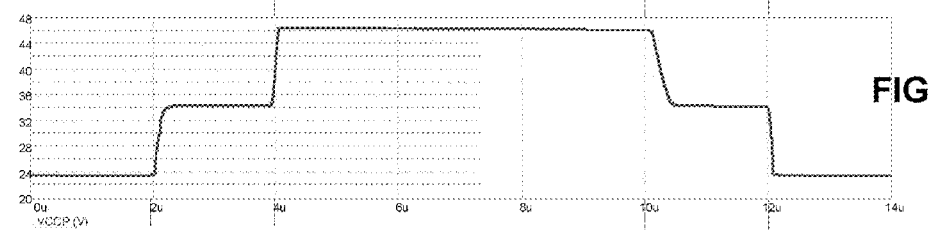
Figure 11C:
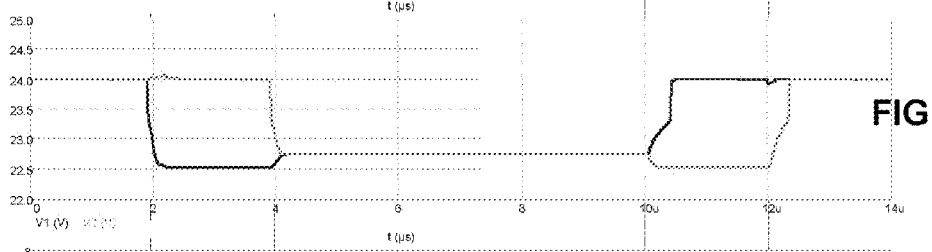
Figure 11D:
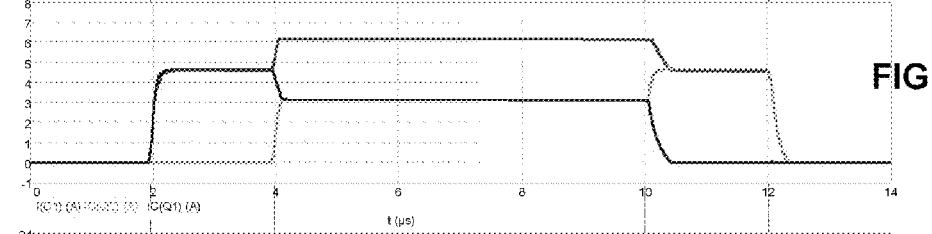
Figure 11E:
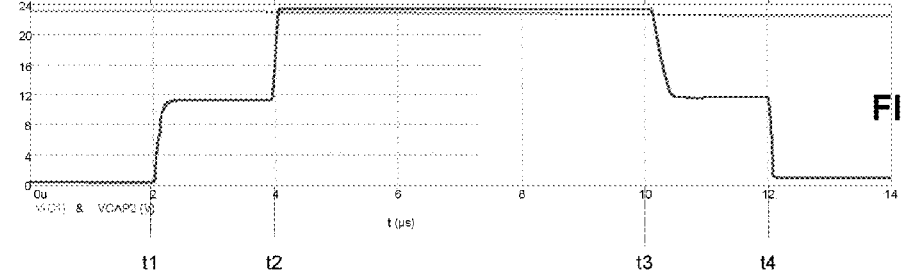

FIGS. 11A-11E are exemplary waveforms of signals in the charge pump in FIG. 10. Specifically, FIG. 11A is an exemplary waveform of the input signal, FIG. 11B is an exemplary waveform of the output of the charge pump VCCP, FIG. 11C is an exemplary waveform of the control signal V1, FIG. 11D is an exemplary waveform of the current I(Q1) passing the switching transistor Q1, I(Q2) passing the switching transistor Q2 and I(C1) passing the capacitor C1, and FIG. 11E is an exemplary waveform of the voltage VCAP1 at the bottom part of the capacitor C1.

When t=0, the input signal to the amplifier 101 may be below the thresholds T1 and T2, as shown in FIG. 11A; and both control signals V1 and V2 may be high, as shown in FIG. 11C. FIG. 11D indicates that both switching transistors Q1 and Q2 may be off, since the currents passing through transistors Q1 and Q2 are close to 0. Similarly to the charge pump 500 shown in FIG. 5, VCAP1≈0V (as shown in FIG. 11E), and VCCP≈23.5V (as shown in FIG. 11B).

When t=t1, the input signal to the amplifier 101 may exceed the threshold T1 but still be below the threshold T2, as shown in FIG. 11A; and the control signal V1 may turn low while the control signal V2 may stay high, as shown in FIG. 11C. The control signal V1 may turn the switching transistor Q1 partly on (as shown in FIG. 11D), and push VCAP1 from 0V to about 11.5V (as shown in FIG. 11E). Since the voltage across the capacitor C1 cannot change instantly, the additional 11.5V at VCAP1 may in turn push VCCP from 23.5V to about 35V (as shown in FIG. 11B).

When t=t2, the input signal to the amplifier 101 may exceed both the threshold T1 and the threshold T2, as shown in FIG. 11A; and the control signal V1 may stay low while the control signal V2 may turn low as well, as shown in FIG. 11C. The switching transistor Q2 may be turned partly on (as shown in FIG. 11D). The control signal V2 may add another 11.5V to the bottom of the capacitor C1, pushing VCAP1 from about 11.5V to about 23V (as shown in FIG. 11E). The VCAP1 may then push VCCP from 35V to about 46.5V (as shown in FIG. 11B).

When t=t3, the input signal to the amplifier 101 may fall below the threshold T2 but still exceed the threshold T1, as shown in FIG. 11A; and the control signal V2 may turn high while the control signal V1 may stay low, as shown in FIG. 11C. The switching transistor Q2 may be switched off (as shown in FIG. 11D) and stop adding voltage to the bottom of the capacitor C1. The switching transistor Q1 may stay turned on (as shown in FIG. 11D) and continue to add about 11.5 v to the bottom of the capacitor C1. As a result, VCAP1 may drop to about 11.5V (as shown in FIG. 11E), and VCCP may drop to about 35V (as shown in FIG. 11B).

When t=t4, the input signal to the amplifier 101 may fall below both the threshold T1 and the threshold T2, as shown in FIG. 11A; and both control signals V1 and V2 may be high, as shown in FIG. 11C. Both switching transistors Q1 and Q2 may be turned off (as shown in FIG. 11D), VCAP1 may drop to about 0V (as shown in FIG. 11E), and VCCP may drop to about 23.5V (as shown in FIG. 11B).

Thus, the charge pump in FIGS. 9 and 10 may provide an additional output voltage step to further reduce unnecessary power dissipation. Instead of two output voltage steps shown in FIG. 6B, the output voltage VCCP of the charge pump in FIGS. 9 and 10 may have 3 steps: about 23.5V (close to the fixed DC voltage) when both control signals are high; about 35V when one of the control signals is low; and about 46.5V (about two times of the fixed DC voltage) when both control signals are low, as shown in FIG. 11B. More switching transistors may be added at the bottom of the capacitor C1, with each additional switching transistor generating an additional step in the output voltage.

Various changes may be made to the circuit in FIG. 10. For example, instead of turning the transistors partly on, a DC voltage of 12V may be applied to the emitter of the transistors Q1 and Q2. In addition, changing the threshold of a comparator may change the drive strength of the comparator, and consequently the drive strength of the switching transistor.

Figure 12:
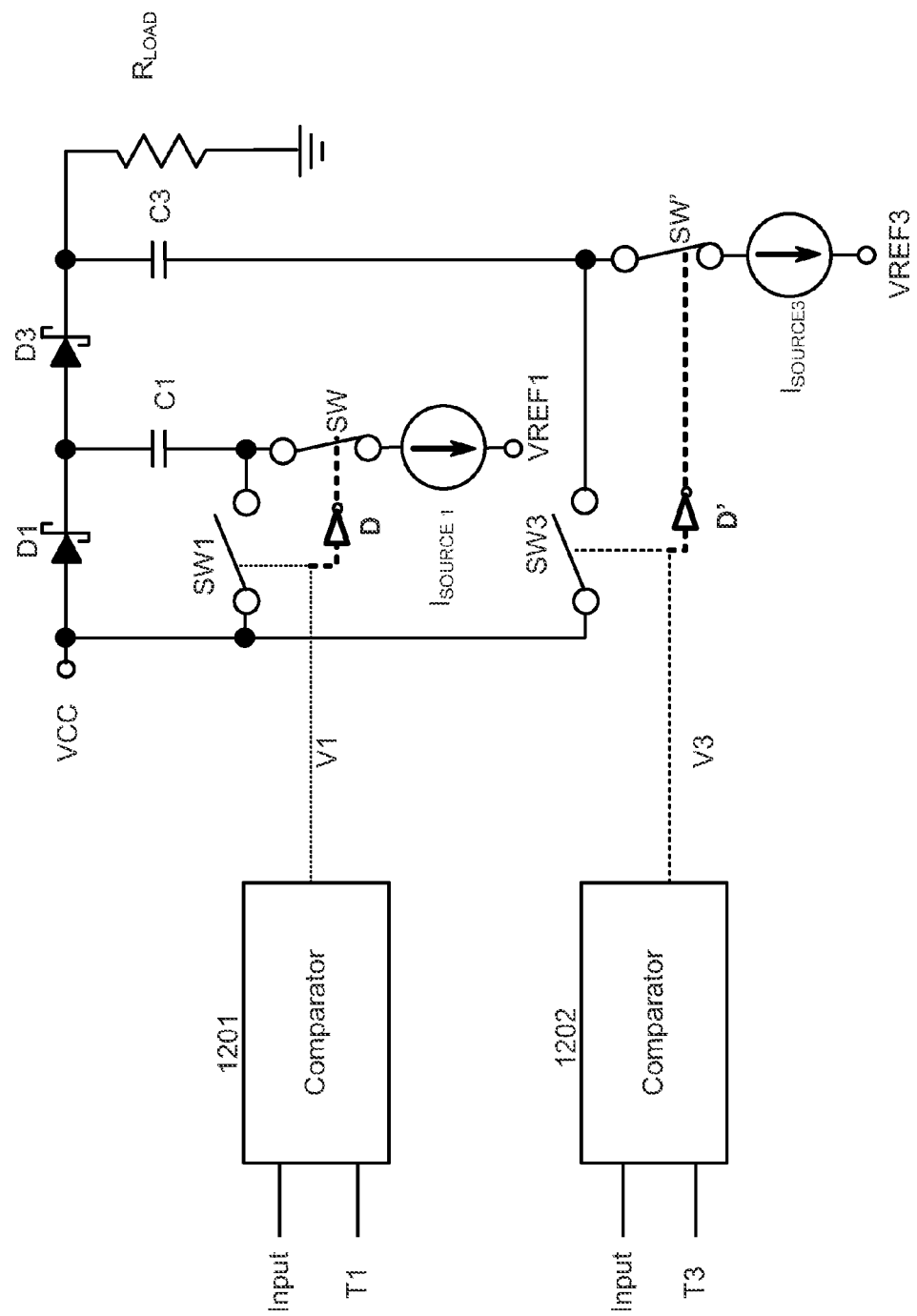
FIG. 12 is a block diagram of a charge pump according to one embodiment of the present invention.

FIG. 12 is a block diagram of a charge pump according to one embodiment of the present invention. A second charge pump driven by a control signal V3 may be added to the circuit 300 shown in FIG. 3. The control signal V3 may be a binary output of a comparator 1202 which compares the input to the amplifier 101 and a third threshold T3, which may be higher than the threshold T1, so as to add a step to the output voltage VCCP. The second charge pump may include a switch SW3 controlled by the control signal V3, a current source $I_{SOURCE3}$, a capacitor C3 and a diode D3. The current source $I_{SOURCE1}$ may be coupled to a reference voltage $V_{REF1}$, and the current source $I_{SOURCE3}$ may be coupled to a reference voltage $V_{REF3}$ which must be a lower potential then $V_{REF1}$. V1 from a comparator 1201 and V3 from the comparator 1202 may be set to saturate SW1 and SW3. Similarly to FIG. 3, a switch SW may be used to stop the current source $I_{SOURCE1}$ from pulling current from VCC when the switch SW1 and/or SW3 is closed and the charge pump is activated, and SW' may be used to stop the current source $I_{SOURCE3}$ from pulling current from VCC when the charge pump is activated. A unidirectional isolation device D may be used to stop the current source $I_{SOURCE1}$ from pulling current from V1, and a unidirectional isolation device D' may be used to stop the current source $I_{SOURCE3}$ from pulling current from V3. More charge pumps may be added, with each additional charge pump controlled by a separate comparator and generating an additional step in the output voltage.

Figure 13:
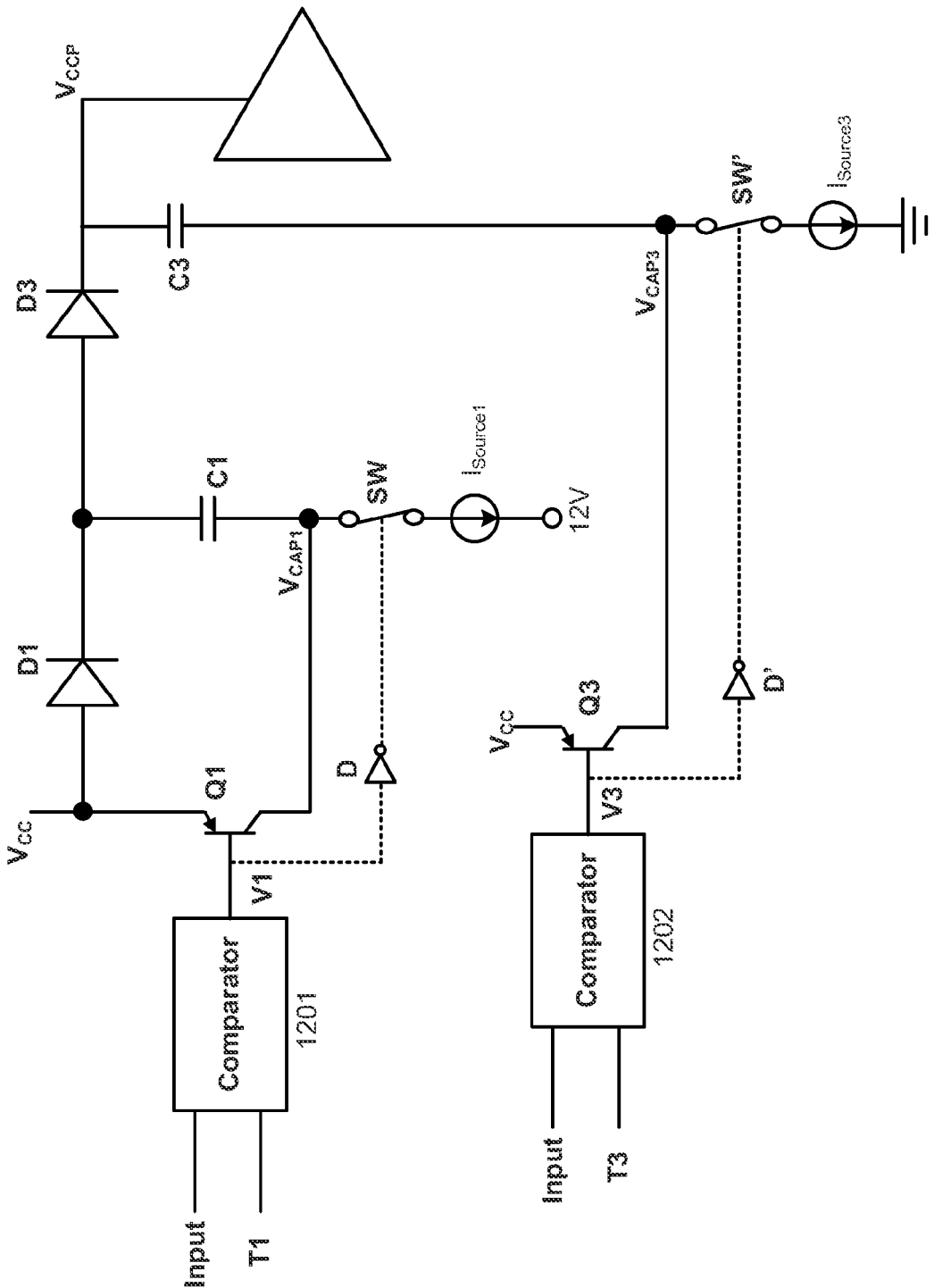
FIG. 13 is a schematic diagram of the charge pump of FIG. 12.

FIG. 13 is a schematic diagram of the charge pump of FIG. 12. A second charge pump controlled by the control signal V3 may be added to the circuit 500 shown in FIG. 5 to generate the additional boosted voltage step. SW3 may be a PNP bipolar transistor Q3, or a p-channel MOSFET. Current sources $I_{SOURCE1}$ and $I_{SOURCE3}$ may be biased to different reference voltages to generate stepped outputs. The switching transistors Q1 and Q3, in two different charge pumps and controlled by two separate comparators 1201 and 1202, may be turned on and off quicker than those in FIG. 10.

Figures 14A, 14B, 14C, 14D, 14E:
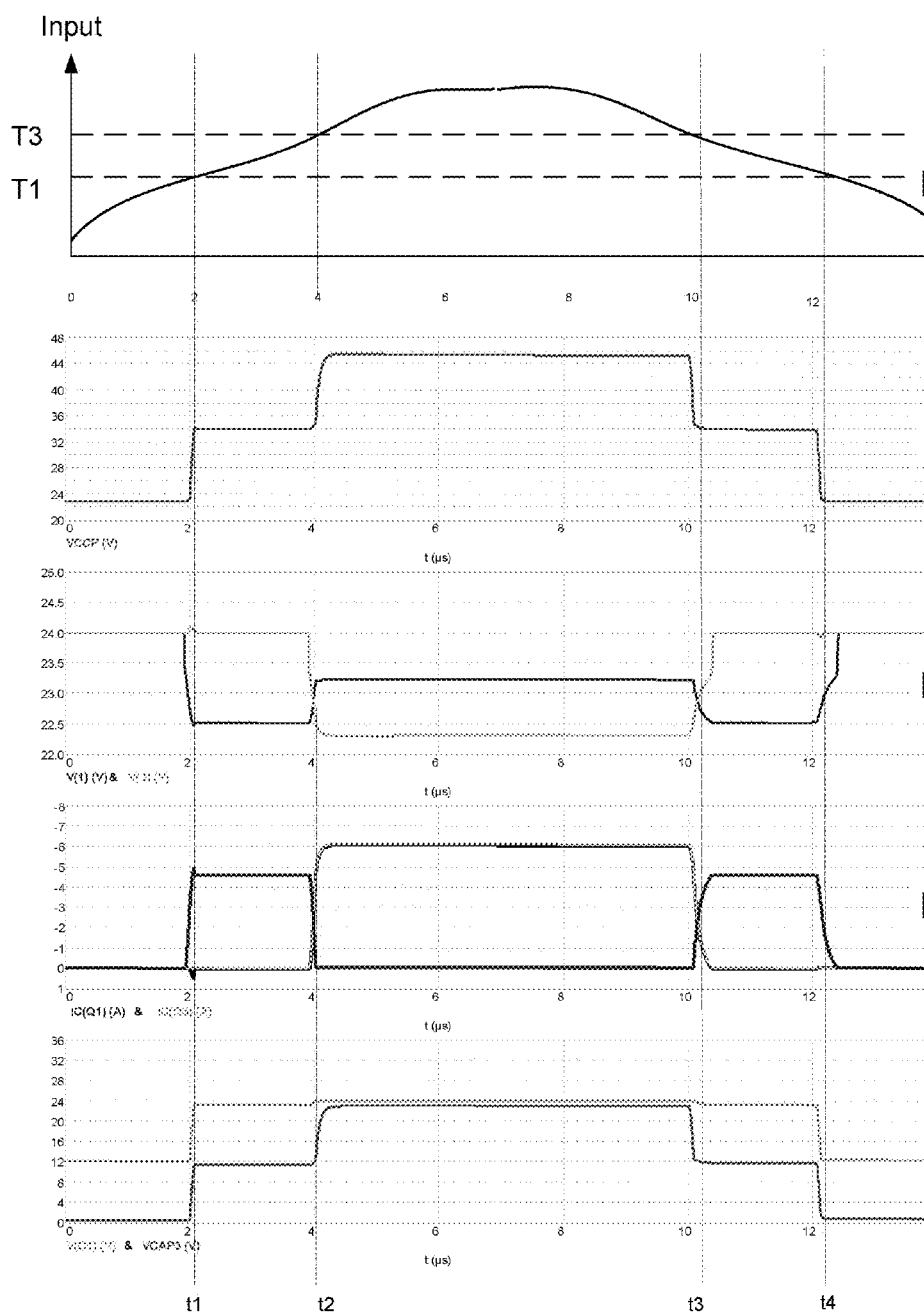
FIGS. 14A-14E are exemplary waveforms of signals in the charge pump shown in FIG. 13.

FIGS. 14A-14E are exemplary waveforms of signals in the charge pump in FIG. 13. Specifically, FIG. 14A is an exemplary waveform of the input signal; FIG. 14B is an exemplary waveform of the output of the charge pump VCCP in FIG. 13, FIG. 14C is an exemplary waveform of the control signal V1, FIG. 14D is an exemplary waveform of the current I(Q1) passing the switching transistor Q1 and I(Q3) passing the switching transistor Q3, and FIG. 14E is an exemplary waveform of the voltage VCAP3 at the bottom part of the capacitor.

When t=0, the input signal to the amplifier 101 may be below both the threshold T1 for V1 and the threshold T3 for V3, as shown in FIG. 14A; and both of the control signals V1 and V3 may be high, as shown in FIG. 14C. Switching transistors Q1 and Q3 may be off (as shown in FIG. 14D). As shown in FIG. 14E, VCAP1 may be about 12V since it is coupled to a 12V voltage over the $I_{SOURCE1}$, and VCAP3 may be about 0V since it is grounded via the $I_{SOURCE3}$. The output voltage VCCP may be about 23V, the result of subtracting the 0.5V voltage drop across D1 and the 0.5V voltage drop across D3 from the 24V of VCC (as shown in FIG. 14B).

When t=t1, the input signal to the amplifier 101 may exceed the threshold T1 but is still below the threshold T3, as shown in FIG. 14A. As a result, the control signal V1 may turn low while the control signal V3 may stay high, as shown in FIG. 14C. In response, the switching transistor Q1 may be turned on (as shown in FIG. 14D), pushing VCAP1 from about 12V to about 23.5V. Since the voltage across the capacitor C1 cannot change instantly, the additional 11.5V at VCAP1 may in turn push the output voltage VCCP from about 23V to about 34.5V (as shown in FIG. 14B).

When t=t2, the input signal to the amplifier 101 may exceed both the threshold T1 and the threshold T3, as shown in FIG. 14A. As a result, the control signal V3 may turn low as well, as shown in FIG. 14C. In response, the switching transistor Q3 may be turned on (as shown in FIG. 14D), pushing VCAP3 from about 11.5V to about 23V (as shown in FIG. 14E). The output voltage VCCP may be pushed one step higher, from about 34.5V to about 46V (as shown in FIG. 14B).

When t=t3, the input signal to the amplifier 101 may fall below the threshold T3 but is still above the threshold T1, as shown in FIG. 14A. As a result, the control signal V3 may turn high while the control signal V1 may stay low, as shown in FIG. 14C. The switching transistor Q2 and the second charge pump may be turned off (as shown in FIG. 14D). VCAP3 may drop from 23V back to about 11.5V (as shown in FIG. 14E), and the output voltage VCCP may drop from 46V to about 34.5V (as shown in FIG. 14B).

When t=t4, as shown in FIG. 14A, the input signal to the amplifier 101 may fall below the threshold T1. The control signal V1 may turn high as well, as shown in FIG. 14C. The first switching transistor Q1 and the first charge pump may be turned off too (as shown in FIG. 14D). VCAP1 may drop from about 23.5V back to about 12V, VCAP3 may drop from 11.5V to about 0V (as shown in FIG. 14E), and the output voltage VCCP may drop from 34.5V to about 23.5V (as shown in FIG. 14B).

Figure 15:
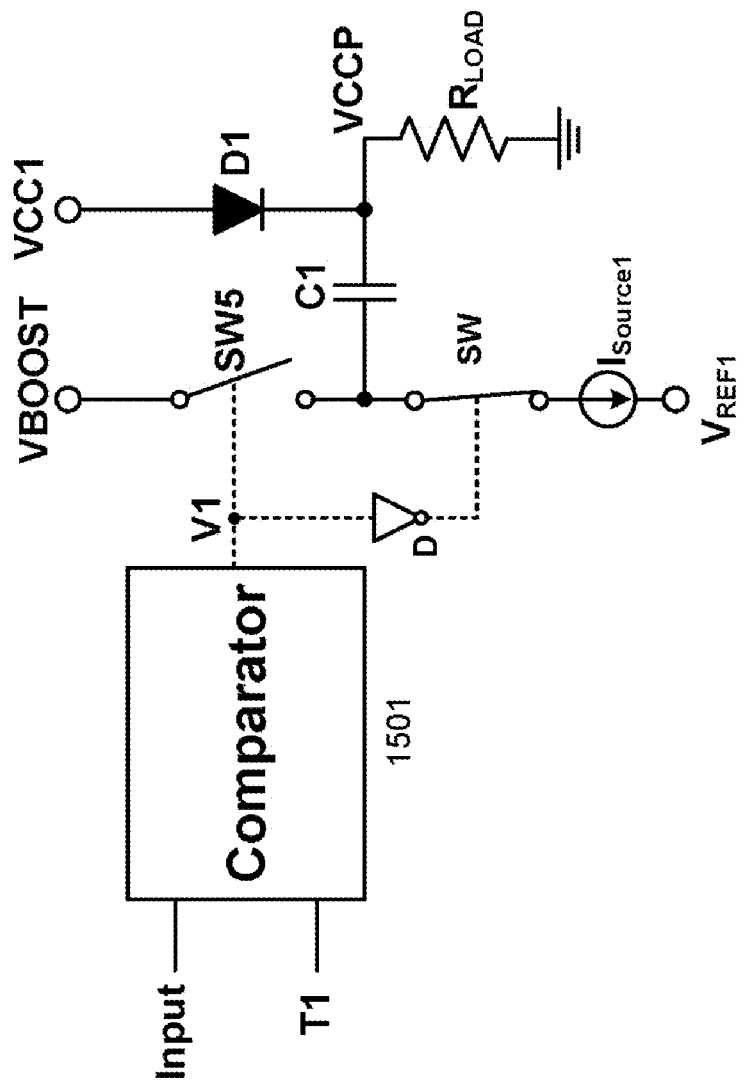
FIG. 15 is a block diagram of a charge pump according to one embodiment of the present invention.

FIG. 15 is a block diagram of a charge pump according to one embodiment of the present invention. Instead of the single power supply VCC shown in FIG. 3, a charge pump 1500 may use two fixed DC voltage power supplies, VCC1 and VBOOST, to further reduce power dissipation in the charge pump. As shown, the charge pump 1500 may include a switch SW5, a capacitor C1 and a diode D1, and may be used to control the power supply for a load $R_{LOAD}$ which may be the power amplifier 101 in FIG. 1. The bottom part of the capacitor C1 may be either grounded or connected to a reference voltage $V_{REF1}$ via a switch SW a current source $I_{SOURCE1}$, and the top part of the capacitor C1 may be coupled to VCC1 via the diode D1, which may be a Schottky diode. The switch SW5 may be coupled between the power supply VBOOST and the bottom part of C1, and controlled by a control signal V1. In one example, the control signal V1 may be a binary output of a comparator 1501 which compares the input signal to the load $R_{LOAD}$ and a threshold T1. When the input signal to the load $R_{LOAD}$ exceeds the threshold T1, the control signal V1 may become 0 and close the switch SW5, so that the power supply VBOOST may be applied to the change pump 1500 and charge the capacitor C1. Otherwise, the control signal V1 may be 1, the switch SW5 may keep open, and only the power supply VCC1 charges the capacitor C5. The voltage VCCP at the top part of the capacitor C1 may be used as an output of the charge pump 1500 to power the load $R_{LOAD}$. The switch SW may be used to stop the current source $I_{SOURCE1}$ from pulling current from VBOOST when the switch SW5 is closed and the charge pump is activated. A unidirectional isolation device D may be used to stop the current source $I_{SOURCE1}$ from pulling current from V1.

Power supplies VCC1 and VBOOST may have any values, selected according to the need of the load $R_{LOAD}$. Since VCC1 is applied to the charge pump 1500 all the time, the lower the value of VCC1, the lower the power dissipation in the charge pump 1500. Since VBOOST is used to push up the VCCP, the higher the value of VBOOST, the higher the peak value of VCCP. In one embodiment, VCC1=VBOOST=6V. When the sum of VCC1 and VBOOST in FIG. 15 is close to VCC in FIG. 3, the waveforms in the charge pump 1500 are similar to those of the charge pump 300, shown in FIGS. 4A-4C.

When t=0, the input signal may be below the threshold T1, the control signal V1 is high, the switch SW5 is open and the charge pump 1500 is powered only by the power supply VCC1. Assume that the voltage across the diode D1 is $V_{D1} \approx 0.5V$ and the voltage across $R_{LOAD}$ is $(V_{CC1}-V_{D1})$. The capacitor C1 may be charged to:

$(V_{CC1}-V_{D1}-V_{REF1})$

When t=t1, the input signal may exceed the threshold T1, the control signal V1 may turn low, and the switch SW5 may be closed. This closed switch is connecting capacitor C1 in series with VBOOST. Assume that the voltage across the switch $V_{SW5} \approx 1V$. The voltage across $R_{LOAD}$ may increase to:

$(V_{BOOST}-V_{SW5})+(V_{CC1}-V_{D1}-V_{REF1})$

When t=t2, the input may fall below the threshold T1, the control signal V1 may turn high, and the switch SW5 may be open. The voltage across $R_{LOAD}$ may return to $(V_{CC1}-V_{D1})$. The voltage across the capacitor C1 may decrease to $(V_{CC1}-V_{D1}-V_{REF1})e^{-(t2-t1)/(C \times RLOAD)}-(V_{BOOST}-V_{SW5})(1-e^{-(t2-t1)/(C \times RLOAD)})$ and may begin to recharge.

When t=t3, the capacitor C1 may be fully charged, and the duty cycle may be:

$$\frac{(t2-t1)}{(t3-t2)} = \frac{1}{C(VCC1-VD1-VREF1+VBOOST-VSW5)} \cdot \frac{1}{1+\frac{(1-e^{-(t2-t1)/C \times RLOAD})}{ISOURCE1 \times (t2-t1)}}$$

Figure 16:
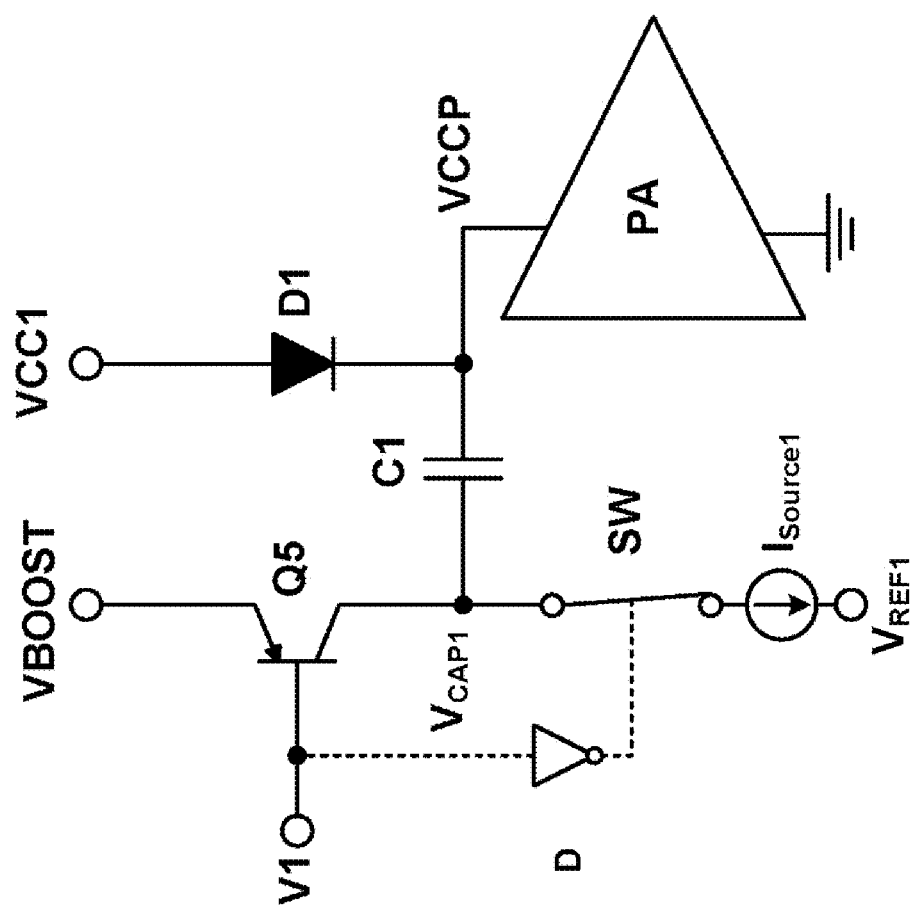
FIG. 16 is a schematic diagram of the charge pump of FIG. 15.

FIG. 16 illustrates a schematic diagram of the charge pump 1500 shown in FIG. 15. The switch SW5 may be a PNP bipolar transistor Q5. Alternatively, it may be a P-channel MOSFET. The switching transistor Q5 may have its base coupled to the control signal V1, its emitter coupled to the fixed DC voltage VBOOST, and its collector coupled to the bottom part of the capacitor C1.

Figure 17:
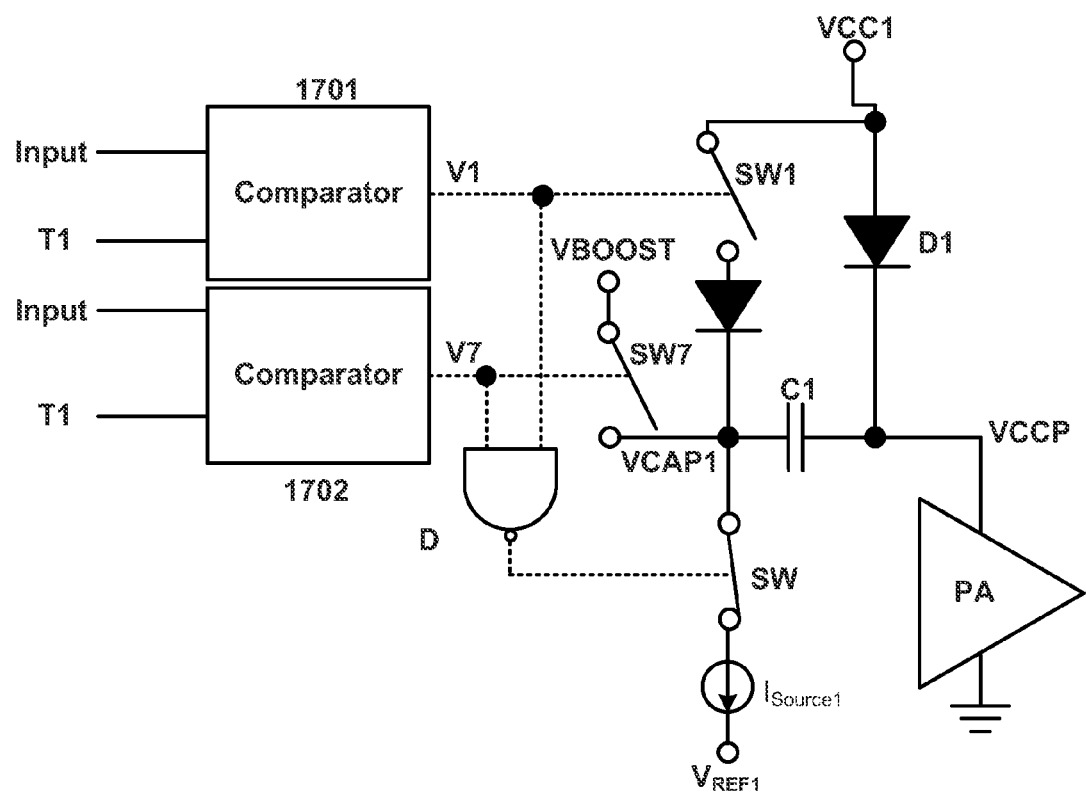
FIG. 17 is a block diagram of a charge pump according to one embodiment of the present invention.

FIG. 17 is a block diagram of a charge pump according to one embodiment of the present invention. A second charge pump driven by a control signal V7 may be added to the circuit 300 shown in FIG. 3. The control signal V7 from a comparator 1702 may be a binary output of a comparator which compares the input to the amplifier 101 and a threshold T7, which may be higher than the threshold T1, so as to add a step to the output voltage VCCP. The second charge pump may include a switch SW7 controlled by the control signal V7, a supply voltage VBOOST and a diode D7. The current source $I_{SOURCE1}$ may be coupled to a reference voltage $V_{REF1}$. V1 from a comparator 1701 and V7 from the comparator 1702 may be set to saturate SW1 and SW7. More charge pumps may be added, with each additional charge pump controlled by a separate comparator and supply voltage and generating an additional step in the output voltage. The switch SW and the unidirectional isolation device D may be used to stop the current source $I_{SOURCE1}$ from pulling current from VBOOST, V1 and/or V7.

Figure 18:
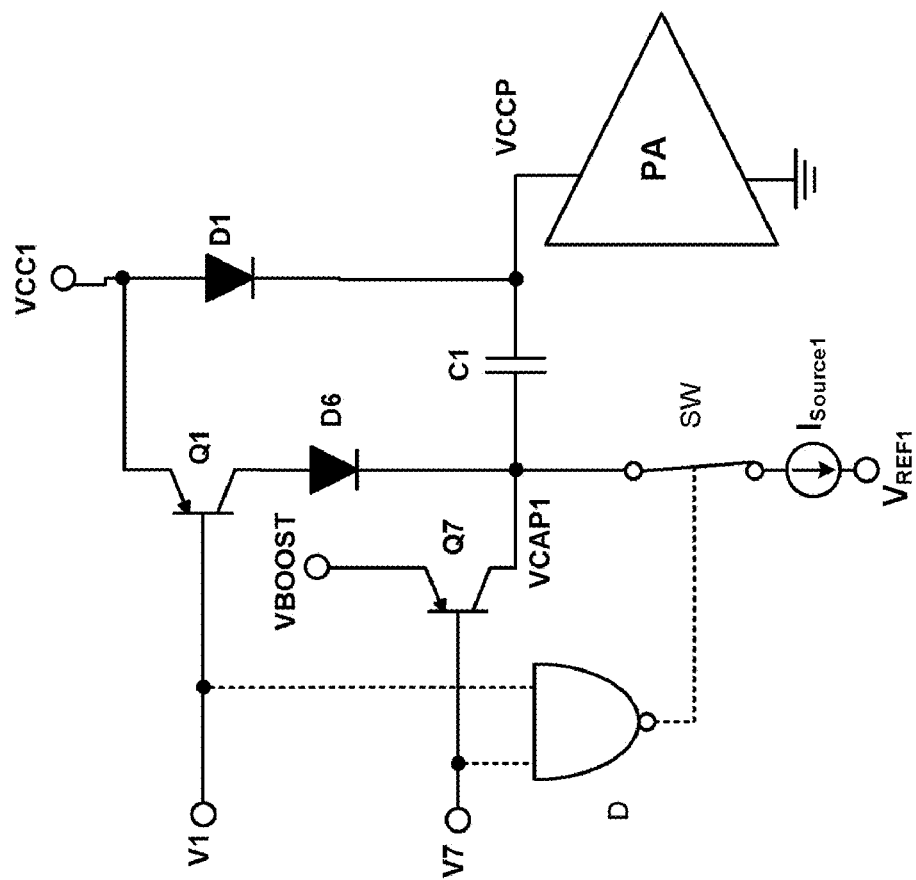
FIG. 18 is a schematic diagram of the charge pump of FIG. 17.

FIG. 18 is a schematic diagram of the charge pump of FIG. 17. A second charge pump controlled by the control signal V7 may be added to the circuit 500 shown in FIG. 5 to generate the additional boosted voltage step. SW7 may be a PNP bipolar transistor Q7, or a p-channel MOSFET. Current sources $I_{SOURCE1}$ may be biased to reference voltage and VBOOST which is connected to Q7 to generate stepped outputs. The switching transistors Q1 and Q7, in two different charge pumps and controlled by two separate comparators, may be turned on and off quicker than those in FIG. 10.

Further embodiments are also possible, which are the result of subsets of elements of, or variously combining elements of, embodiments described.

What is claimed is:

1. An amplifier system with on-demand power supply boost, comprising:
   an amplifier circuit having an input for an input signal;
   a comparator, having inputs for the input signal and a threshold signal and an output for a binary comparison signal; and
   a charge pump coupled to a power supply with a predetermined supply voltage and comprising:
      a unidirectional isolation device, coupled to the power supply at an input;
      a charge storage device, coupled to an output of the unidirectional isolation device at a first end and to a fixed voltage at a second end, and coupled at the first end to a power input of the amplifier circuit; and
      a switch, coupled between the power supply and the second end of the charge storage device, and being controlled by the binary comparison signal from the comparator.

2. The amplifier system of claim 1, wherein the switch is switched on to couple the second end of the charge storage device to the power supply to boost a voltage at the power input of the amplifier circuit beyond the predetermined supply voltage only when the input signal exceeds the threshold signal.

3. The amplifier system of claim 1, wherein the switch is a transistor.

4. The amplifier system of claim 3, wherein the switch is selected from the group consisting of a PNP bipolar transistor and a p-channel MOSFET.

5. The amplifier system of claim 1, wherein the fixed voltage is provided by a current source.

6. The amplifier system of claim 1, further comprising:
a second comparator, having inputs for the input signal and a second threshold signal and an output for a second binary comparison signal; and
a second switch, coupled to the second end of the charge storage device, and being switched on only when the input signal exceeds the second threshold signal so as to generate an additional boosted step in the voltage at the power input of the amplifier circuit.

7. The amplifier system of claim 6, wherein the second switch is a transistor.

8. The amplifier system of claim 6, wherein the second switch is coupled to the power supply and is switched partly on to generate the additional boosted step in the voltage at the power input of the amplifier circuit.

9. The amplifier system of claim 6, wherein the second switch is coupled to the same power supply to generate the additional boosted step in the voltage at the power input of the amplifier circuit.

10. The amplifier system of claim 5, further comprising: a third switch, controlled by the binary comparison signal from the comparator to disconnect the charge storage device from the current source.

11. The amplifier system of claim 10, further comprising: a second unidirectional isolation device, coupled between the output of the comparator and a control end of the third switch.

12. An amplifier system with on-demand power supply boost, comprising:
an amplifier circuit having an input for an input signal;
a comparator, having inputs for the input signal and a first threshold signal and an output for a binary comparison signal; and
a charge pump coupled to a power supply with a predetermined supply voltage and comprising:
a unidirectional isolation device, coupled to the power supply at an input;
a charge storage device, coupled to an output of the unidirectional isolation device at a first end and to a fixed voltage at a second end;
a switch, coupled between the power supply and the second end of the charge storage device, and being controlled by the binary comparison signal,
a second comparator, having inputs for the input signal and a second threshold signal and an output for a second binary comparison signal; and
a second charge pump comprising:
a second unidirectional isolation device, coupled to the output of the unidirectional isolation device at an input;
a second charge storage device, coupled to an output of the second unidirectional isolation device at a first end and to a second fixed voltage at a second end, and coupled at the first end to a power input of the amplifier circuit; and a second switch, coupled between the power supply and the second end of the second charge storage device, and being controlled by the second binary comparison signal,
wherein the switch is switched on to couple the second end of the charge storage device to the power supply to boost a voltage at the power input of the amplifier circuit beyond the predetermined supply voltage only when the input signal exceeds the first threshold signal, and
wherein the second switch is switched on to couple the second end of the second charge storage device to the power supply to generate an additional boosted step in the voltage at the power input of the amplifier circuit only when the input signal exceeds the second threshold signal.

13. The amplifier system of claim 12, wherein the second switch is a transistor.

14. The amplifier system of claim 12, wherein the second switch is a PNP bipolar transistor.

15. The amplifier system of claim 12, wherein the second switch is a p-channel MOSFET.

16. The amplifier system of claim 12, wherein the second fixed voltage is provided by a current source.

17. A method for providing on-demand power supply boost to an amplifier system, comprising:
comparing an input signal to an amplifier circuit with a threshold;
powering the amplifier circuit with a voltage from a charge pump which is coupled to a power supply with a predetermined supply voltage; and
activating the charge pump to boost the voltage powering the amplifier circuit beyond the predetermined supply voltage only when the input signal exceeds the threshold.

18. The method of claim 17, further comprising: when the input signal exceeds the threshold, switching on a switch to activate the charge pump.

19. The method of claim 17, further comprising:
comparing the input signal to the amplifier circuit with a second threshold; and
generating an additional boosted step in the voltage powering the amplifier circuit when the input signal exceeds the second threshold.

20. The method of claim 17, further comprising:
comparing the input signal to the amplifier circuit with a third threshold; and
activating a second charge pump to provide an additional boosted step in the voltage powering the amplifier circuit when the input signal exceeds the third threshold.

21. An amplifier system with on-demand power supply boost, comprising:
an amplifier circuit having an input for an input signal;
a comparator, having inputs for the input signal and a threshold signal and an output for a binary comparison signal; and
a charge pump coupled to a first power supply with a predetermined supply voltage and a second power supply, and comprising:
a unidirectional isolation device, coupled to the first power supply at an input;
a charge storage device, coupled to an output of the unidirectional isolation device at a first end and to a fixed voltage at a second end, and coupled at the first end to a power input of the amplifier circuit; and a switch, coupled between the second power supply and the second end of the charge storage device, and being controlled by the binary comparison signal from the comparator.

22. The amplifier system of claim 21, wherein the switch is switched on to couple the second end of the charge storage device to the second power supply to boost a voltage at the power input of the amplifier circuit beyond the predetermined supply voltage only when the input signal exceeds the threshold signal.

23. The amplifier system of claim 21, wherein the switch is a transistor.

24. The amplifier system of claim 23, wherein the switch is selected from the group consisting of a PNP bipolar transistor and a p-channel MOSFET.

25. The amplifier system of claim 21, wherein the fixed voltage is provided by a current source.

* * * * *